United States Patent

Väisänen et al.

[11] Patent Number: 5,214,372
[45] Date of Patent: May 25, 1993

[54] LINEARIZING CIRCUIT FOR DECTECTION OF A RF-POWER SENSOR

[75] Inventors: Risto Väisänen; Jukka Sarasmo; Vesa Pekkarinen, all of Salo, Finland

[73] Assignee: Nokia Mobile Phones Ltd., Salo, Finland

[21] Appl. No.: 777,453

[22] Filed: Oct. 11, 1991

Related U.S. Application Data

[63] Continuation of Ser. No. 505,348, Apr. 2, 1990, abandoned.

[30] Foreign Application Priority Data

May 11, 1989 [FI] Finland ................... 892297

[51] Int. Cl.$^5$ .................... G01R 15/10; G01R 21/04
[52] U.S. Cl. ................... 324/95; 324/114; 324/119; 307/261
[58] Field of Search ............ 324/95, 119, 114; 307/261, 351

[56] References Cited

U.S. PATENT DOCUMENTS

| | | | |
|---|---|---|---|
| 3,329,896 | 7/1967 | Groot | 324/119 |
| 3,838,411 | 9/1974 | Van der Meer | 340/517 |
| 3,947,706 | 3/1976 | Holmes | 324/119 |
| 3,962,631 | 6/1976 | Poppinger | 324/119 |
| 4,013,961 | 3/1977 | Colebourn | 455/126 |
| 4,065,682 | 12/1977 | Evans | 307/261 |
| 4,132,907 | 2/1979 | Davis | 328/26 |
| 4,333,141 | 6/1982 | Nagano | 307/261 |
| 4,409,500 | 10/1983 | Welland | 307/261 |
| 4,547,728 | 10/1985 | Mecklenburg | 324/95 |
| 4,628,256 | 12/1986 | Powell | 324/95 |
| 4,647,848 | 3/1987 | Barrett | 324/95 |
| 4,811,191 | 3/1989 | Miller | 307/261 |
| 4,815,106 | 3/1989 | Propp et al. | 375/96 |
| 4,941,080 | 7/1990 | Sieborger | 307/261 |
| 4,943,764 | 7/1990 | Szente et al. | 324/95 |

OTHER PUBLICATIONS

J. Hawke, "Low Offset Peak Detector Uses Transistors", Electronic Engineering, vol. 49, No. 598, p. 23 (Oct. 1977).
P. Blythin, "High Frequency Low Offset Peak Hold Circuit", IBM Technical Disclosure Bulletin, vol. 21, No. 1, pp. 349-350 (Jun. 1978).
D. G. East et al., "Universal Peak Sensing Detection and Retention Device", IBM Technical Disclosure Bulletin, vol. 7, No. 6, pp. 533-534 (Nov. 1984).
A. P. Nevezhin et al., "Wideband Linear Detector", Instruments & Experimental Techniques, vol. 30, No. 4, Part 2, pp. 894-895 (Jul./Aug. 1987).

Primary Examiner—Ernest F. Karlsen
Assistant Examiner—William J. Burns
Attorney, Agent, or Firm—Darby & Darby

[57] ABSTRACT

The present invention concerns a circuit processes the power signal emitted from an RF power sensor (SK) of a radio telephone to create a detector voltage which is proportional to the power level of the radio telephone transmitter. The circuit comprises a transistor (Q2) acting as an active rectifier, which in the ascending part of the positive half cycle of the power signal charges a capacitor (C3). During the descending part of the power signal the capacitor starts to discharge with a time constant which is remarkably greater than the cycle length of the power signal. The transistor is biassed by means of a transistor (Q1) so that it is conductive even at the lowest power levels.

3 Claims, 2 Drawing Sheets

LINEARIZING CIRCUIT FOR DECTECTION OF A RF-POWER SENSOR

This is a continuation of application Ser. No. 505,348, filed Apr. 2, 1990, now abandoned.

BACKGROUND OF THE INVENTION

The present invention relates to processing the power obtained from a RF power sensor used in association with digital and analog radio telephones to become a detector voltage in direct linear proportion to the entire power range used.

In radio telephone systems, at both fixed and mobile stations, information regarding the station's power must be obtained in order to control this power. The power control range in radio telephones is wide, and numerous power levels are provided. The power levels must be very stable regardless of temperature. Reaching and maintaining stability is difficult, particularly at extreme temperatures; therefore, the requirements set for the power control of the means are great. Power control is particularly difficult when the power level is low because when the power is on the order of the milliwatt magnitude, the voltages obtained from the sensor of the power level detector are very low. The situation becomes even more difficult if the steps of the power levels are small. For instance, the power range in the GSM system is organized into only 2 dB steps, and this emphasizes the effect of the exponential ratio of power and voltage. Thus, the difference between the DC voltages of adjacent small power levels obtained from the power sensor remains marginal. Hence, the power control resolution is required to be extremely wide, which emphasizes the effect of interferences and ambient factors. The instability of low power levels increases costs for radio telephone production, and there is a risk that, owing to the effect of aging and other factors, the radio telephone's ability to meet the requirements set for its power stability will deteriorate over time.

It is known in the art to employ a circuit implementing detector diodes as a power level detector. The voltage obtained from this kind of detector is exponentially proportional to the power (dB) to be indicated, due to, for instance, the specific graph (characteristics) of the diode. As a result, at low power levels small power variations cause a hardly observable change in the voltage of the detector so that the above-mentioned problems still exist.

SUMMARY OF THE INVENTION

The present invention eliminates the above-mentioned drawbacks by linearizing the ratio between the output voltage for the detector of a RF power sensor and the power transmitted from the sensor. According to the circuit of the present invention, the differential voltages of the adjacent power levels obtained from the sensor are remarkably more dependent of the power in the entire power range to be indicated than when a diode detector is used.

The invention is characterized by an having a current proportional to the power to be indicated. The voltage across the capacitor is in the power range to be indicated and is proportional to the power emitted from the sensor. The active rectifier means is biassed so that its input impedance is independent of the control signal level obtained from the power sensor, and is conductive even on the lowest power levels emitted by the sensor.

BRIEF DESCRIPTION OF THE DRAWINGS

The circuit of the invention is described in more detail referring to the enclosed figures, in which.

DESCRIPTION OF AN ILLUSTRATIVE EMBODIMENT

Figure 1:
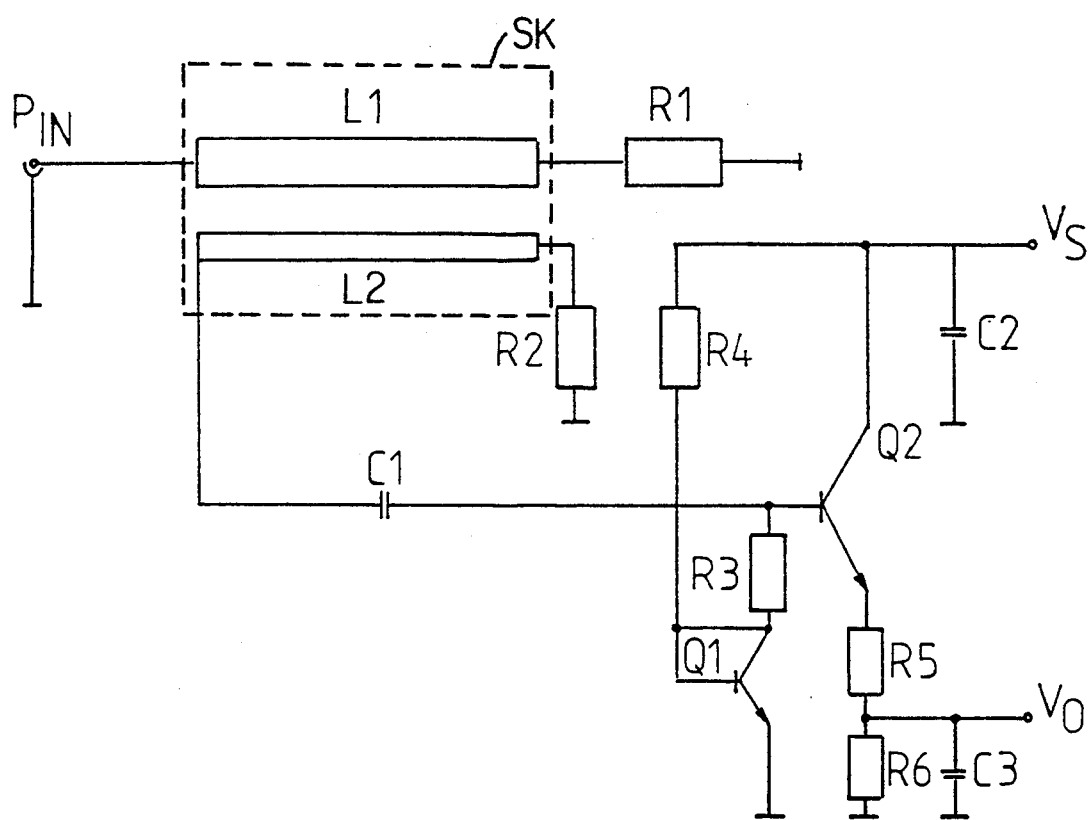
FIG. 1 presents a principle coupling of the circuit.

As shown in FIG. 1, a directional switch SK is used for the power sensor. The directional coupler may be implemented as a microstrip, a strip line or a coaxial coupler. A resistance R2 not only adapts the directional coupler to the circuit but also draws the power coupled to the directional coupler from the power reflected from the load towards the transmitter. A transistor Q2, is used as an active rectifier which charges a capacitor C3 from the supply voltage Vs of the circuit of the invention. The power obtained from the directional coupler SK is carried to the base of the transistor Q2. For biasing the transistor Q2, a similar transistor Q1 is used, which transistor is wired to be a diode. The bias transistor Q1 receives current through a resistor R4 from the supply voltage Vs of the circuit. Since the base and the collector of the transistor are coupled together, a small quantity of current is supplied to the base of the transistor Q2 which is acting as the rectifier, whereby the transistor Q2 is biased with a small, idle current of about 100 $\mu A$, and the base emitter voltage of the transistor Q2 is very small, about 80 mV.

Since the transistors Q1 and Q2 are of the same type, the base emitter voltages are same and no other temperature compensation is needed. The time constant $T = R6 \times C3$ of the circuit including capacitor C3 and resistor R6 which is charged by the transistor Q2 is selected to be such that it is a lot greater than the cycle time of the power Pin.

The circuit of the invention operates as follows.

The directional coupler SK is so coupled that when positive power, travels in the direction of the resistance R1, along line L1 power of equal size is induced in the other line L2 of the coupler and flows in the direction of the transistor Q2. During ascending part of positive half cycle of the power, Pin, the transistor Q2 starts to conduct and rapidly charges the capacitor C3 through the resistor R5. The signal Pin is not loaded by the charging of the capacitor C3 because the charging current is obtained directly from the supply voltage Vs. During the descending part of a power Pin, the transistor Q2, acting as the rectifier, ceases conducting because the voltage remaining across the capacitor is effective to reverse bias; the base emitter junction of transistor Q2. The capacitor C3 now discharges slowly through the resistor R6 of the emitter circuit of the transistor Q2. The time constant $(T = R6 \times C3)$ of the discharge is selected to be far greater than the cycle time of the power Pin. As a result, the output voltage Vo of the detector, which is proportional to the power Pin, is obtained from the capacitor C3.

Figure 2:
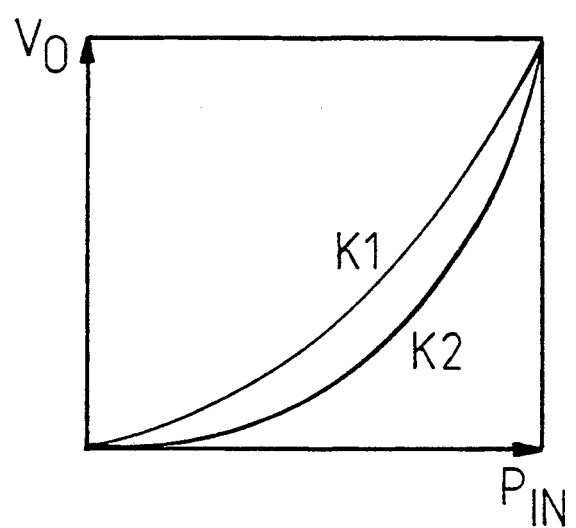
FIG. 2 presents a response graph of the circuit and a response graph of the circuit executed with diodes.

By biasing the transistor Q2 of the invention with a transistor Q1 of the same type, a sufficient temperature compensation is obtained and, above all, the transistor Q2 is biased for a small idle current of about 100 UA, so it is conductive even at the smallest power levels. The response graph of the circuit remains straight irrespective of the temperature, whereas the response graph of the circuit known in the art, (graph k2 in FIG. 2) which is implements diodes, is a parabola in shape due, e.g., to the specific graph (characteristics) of the diode, and is temperature dependent. As shown in FIG. 2, a change of the power Pin in the circuit known in the art at low power levels represented by range A in FIG. 2 on the response graph k2 causes only an insignificant change in the output voltage Vo of the detector, whereas with the circuit of the invention represented by graph k1 causes a change of the voltage Vo which is significant and is substantially less dependent on whether small or great power levels are employed. The response is therefore more linear than in using a diode detector.

By the circuit of the invention the defects of the circuits of the prior art are eliminated. The circuit is temperature-compensated in a simple fashion, and the circuit comprises a few simple components, and is therefore inexpensive and easy to manufacture in automated production. The range of the circuit dynamics is extensive. The circuit of the invention may be used advantageously in analog and digital radio telephone systems at mobile and fixed stations, but it may also be used in other circuits that require power detectors.

We claim:

1. A circuit for processing an RF power signal obtained from an output of an RF power sensor (SK) used in measuring the transmission power level of a transmitter in order to develop a detector voltage (Vo) which is proportional to said power level, characterized in that the circuit comprises:

an active half-wave rectifier means including a first rectifying transistor (Q2) controlled by the RF power signal obtained from the power sensor (SK), the first transistor having its base connected to the power signal at the sensor output;

an energy storing means (C3) charged by said half-wave rectifier means (Q2) during a positive half cycle of the RF power signal obtained from the power sensor (SK), the emitter of said half-wave rectifier means connected to the energy storage means (C3) and the voltage of said storage means being the detector voltage (Vo), resistance means (R6) connected to discharge said storage means during the descending part of the power signal; and a biasing means (Q1), which biases said half-wave rectifier means (Q2) so that said half-wave rectifier means is conductive even at the lowest levels of the positive half of the RF power signal obtained from the power sensor (SK).

2. A circuit for processing an RF power signal obtained from an output of an RF power sensor (SK) used in measuring the transmission power level of a transmitter in order to develop a detector voltage (Vo) which is proportional to said power level, characterized in that the circuit comprises:

an active rectifier means including a first rectifying transistor (Q2) controlled by the RF power signal obtained from the power sensor (SK), the first transistor having its base connected to the power signal at the sensor output;

an energy storing means (C3) charged by said rectifier means (Q2) during a positive half cycle of the RF power signal obtained from the power sensor (SK), the emitter of said rectifier means connected to the energy storage means (C3) and the voltage of said storage means being the detector voltage (Vo), resistance means (R6) connected to discharge said storage means during the descending part of the power signal; and a biasing means (Q1), which biases the rectifier means (Q2) so that the rectifier means is conductive even at the lowest levels of the positive half of the RF power signal obtained from the power sensor (SK), the biasing means including a second transistor of the same type as the first transistor, and the second transistor (Q1) having its base and collector coupled so as to act as a diode, and the coupled base and collector being coupled to the base of the first transistor (Q2) such that the base/emitter voltage of the first transistor (Q2) is very small, e.g., 80 mV, and the idle current is about 100 µA.

3. A circuit for processing an RF power signal obtained from an output of an RF power sensor (SK) used in measuring the transmission power level of a transmitter in order to develop a detector voltage (Vo) which is proportional to said power level, characterized in that the circuit comprises:

an active rectifier means including a first rectifying transistor (Q2) controlled by the RF power signal obtained from the power sensor (SK), the first transistor having its base connected to the power signal at the sensor output;

an energy storing means (C3) charged by said rectifier means (Q2) during a positive half cycle of the RF power signal obtained from the power sensor (SK), the emitter of said rectifier means connected to the energy storage means (C3) and the voltage of said storage means being the detector voltage (Vo), the energy storing means (C3) including a capacitor which is discharged through resistance means with a time constant which is considerably greater than the cycle length of the power signal;

the resistance means (R6) connected to discharge said storage means during the descending part of the power signal; and a biasing means (Q1), which biases the rectifier means (Q2) so that the rectifier means is conductive even at the lowest levels of the positive half of the RF power signal obtained from the power sensor (SK).

* * * * *